United States Patent
Kocon et al.

(10) Patent No.: US 7,452,777 B2
(45) Date of Patent: Nov. 18, 2008

(54) SELF-ALIGNED TRENCH MOSFET STRUCTURE AND METHOD OF MANUFACTURE

(75) Inventors: Christopher Boguslaw Kocon, Mountaintop, PA (US); Nathan Lawrence Kraft, Pottsville, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 460 days.

(21) Appl. No.: 11/339,998

(22) Filed: Jan. 25, 2006

(65) Prior Publication Data
US 2007/0173021 A1 Jul. 26, 2007

(51) Int. Cl.
*H01L 21/336* (2006.01)

(52) U.S. Cl. .................. 438/270; 438/197; 438/299; 257/331; 257/E29.146; 257/E29.156

(58) Field of Classification Search ............... None
See application file for complete search history.

(56) References Cited

U.S. PATENT DOCUMENTS

| 2004/0195620 A1* | 10/2004 | Chuang et al. ............ 257/335 |
| 2005/0079676 A1 | 4/2005 | Mo et al. |
| 2005/0167742 A1 | 8/2005 | Challa et al. |
| 2005/0224891 A1* | 10/2005 | Xu ............................ 257/382 |

OTHER PUBLICATIONS

International Search Report and Written Opinion of the ISA, PCT/US06/61687, mailed Sep. 2, 2008, 9pp.

* cited by examiner

*Primary Examiner*—Thanh V. Pham
*Assistant Examiner*—Shaka Scarlett
(74) *Attorney, Agent, or Firm*—Townsend and Townsend and Crew LLP

(57) ABSTRACT

A trench gate FET is formed as follows. A well region is formed in a silicon region. A plurality of active gate trenches and a termination trench are simultaneously formed in an active region and a termination region of the FET, respectively, such that the well region is divided into a plurality of active body regions and a termination body region. Using a mask, openings are formed over the termination body region and the active body region. Dopants are implanted into the active body regions and the termination body region through the openings thereby forming a first region in each active and termination body region. Exposed surfaces of all first regions are recessed so as to form a bowl-shaped recess having slanted walls and a bottom protruding through the first region such that remaining portions of the first region in each active body region form source regions that are self-aligned to the active gate trenches.

22 Claims, 6 Drawing Sheets

SELF-ALIGNED TRENCH MOSFET STRUCTURE AND METHOD OF MANUFACTURE

CROSS-REFERENCES TO RELATED APPLICATIONS

This application relates to the patent application Ser. No. 11/317,653, titled "Trench Field Plate Termination For Power Devices," filed Dec. 22, 2005, incorporated herein by reference in its entirety for all purposes.

BACKGROUND OF THE INVENTION

There continues to be a growing demand for semiconductor power devices (i.e., devices capable of carrying large currents at high voltages). Such devices include bipolar transistors, insulated gate bipolar transistors (IGBT), metal oxide semiconductor field effect transistors (MOSFET) and other types of field effect transistors. Notwithstanding significant advances in power device technology, there remains a need for still higher-performing and more cost-effective devices. As the complexity and sophistication of power devices increases, the number of process steps and masks in the manufacturing process also increases, significantly increasing the manufacturing costs. Thus, processing techniques which help reduce the number of process steps and/or masks while maintaining or even increasing the device performance would be desirable.

Furthermore, it is desirable to increase the current density relative to the total die area of a device. One of the limiting factors to higher current ratings is the breakdown voltage, particularly in the edge termination region where array junctions terminate. Because semiconductor junctions include curvatures, numerous techniques are employed to avoid otherwise high concentration of electric field lines. It is conventional in power device design to incorporate edge termination structures with planar field plates along the outer periphery of the device in order to ensure that the breakdown voltage in this region of the device is not any lower than in the active region of the device. However, termination structures (particularly the planar field plate variety) occupy relatively large areas of the die and require additional masking and processing steps, thus resulting in increased costs.

Thus, there is a need for improved power devices with enhanced trench termination structures and cost-effective methods of forming the same.

BRIEF SUMMARY OF THE INVENTION

In accordance with an embodiment of the invention, a trench gate FET is formed as follows. The FET is formed in a semiconductor die comprising an active region for housing active transistor cells and a termination region surrounding the active region. A well region is formed in the active region and the termination region at the same time. The well region is formed in a silicon region having a conductivity type opposite that of the well region. A plurality of active gate trenches are formed in the active region simultaneously with a non-active termination trench formed in the termination region. The plurality of active gate trenches and the non-active termination trench extend into and penetrate through the well region to there by divide the well region into a plurality of active body regions in the active region and a termination body region in the termination region. Using a mask, an opening is formed over the termination body region and an opening is formed over the active region. Dopants are implanted into the active body regions through the opening over the active region and into the termination body region through the opening over the termination body region, thereby forming a first region in each active body region and in the termination body region. The first regions have a conductivity type opposite that of the well region. Exposed surfaces of all first regions are recessed using a silicon etch to form a bowl-shaped silicon recess having slanted walls and a bottom protruding through each first region such that portions of each first region remain in a corresponding active body region. The remaining portions of the first regions in the active body regions form source regions which are self-aligned to the active gate trenches.

In one embodiment, dopants are implanted into the bowl-shaped silicon recesses to form a heavy body region in each active body region and in the termination body region. The heavy body regions have the same conductivity type as the well region.

In another embodiment, a metal layer is formed over the semiconductor die. The metal layer is then patterned to form: (i) a source metal layer extending into each bowl-shaped silicon recess in the active region to electrically contact the source regions and the heavy body regions in the active region, and (ii) a field plate extending into the non-active termination trench and into the bowl-shaped silicon recess formed in the termination body region to electrically contact the heavy body region formed in the termination body region, wherein the source metal layer and the field plate are insulated from one another.

In another embodiment, a termination dielectric layer is formed in the non-active termination trench. A field plate comprising conductive material is formed in the trench over the termination dielectric layer. The termination dielectric layer insulates all portions of the field plate inside the non-active termination trench from all silicon regions surrounding the non-active termination trench. The field plate is formed so as to extend out of the non-active termination trench and into the bowl-shaped silicon recess formed in the termination body region to thereby electrically contact the heavy body region formed in the termination body region.

In yet another embodiment, the non-active termination trench extends to an edge of the semiconductor die such that the non-active termination trench forms a vertical wall at which the well region terminates.

In yet another embodiment, non-active gate runner trenches are formed at the same time that the active gate trenches and the non-active termination trench are formed such that the non-active gate runner trench, the active gate trenches and the non-active termination trench extend to the same depth. A recessed gate electrode is formed in each active gate trench and a recessed gate runner electrode is formed in the non-active gate runner trench at the same time. The recessed gate electrode in each active gate trench is electrically connected to the recessed gate runner electrode in the non-active gate runner trench.

In yet another embodiment, the active gate trenches are stripe shaped extending along a first direction, and the non-active gate runner trench extends, at least in part, along a direction perpendicular to and is contiguous with the active gate trenches.

A better understanding of the nature and advantages of the present invention can be gained from the following detailed description and the accompanying drawings.

DETAILED DESCRIPTION OF THE INVENTION

The present invention relates generally to semiconductor power device technology, and more particularly to improved power devices with enhanced termination structures, and methods of forming the same.

FIGS. 1A-1K are simplified cross-section views at various steps of a manufacturing process for forming a self-aligned MOSFET with a trench field plate termination structure, in accordance with an exemplary embodiment of the invention. FIG. 2 is a simplified cross-section view showing a trench gate runner structure formed without requiring additional processing steps to those depicted by FIGS. 1A-1K. All drawings described herein are merely illustrative and thus are not intended to unduly limit the scope of the claims herein. One of ordinary skill in the art would recognize many possible variations, modifications, and alternatives in view of this disclosure.

Figure 1A:
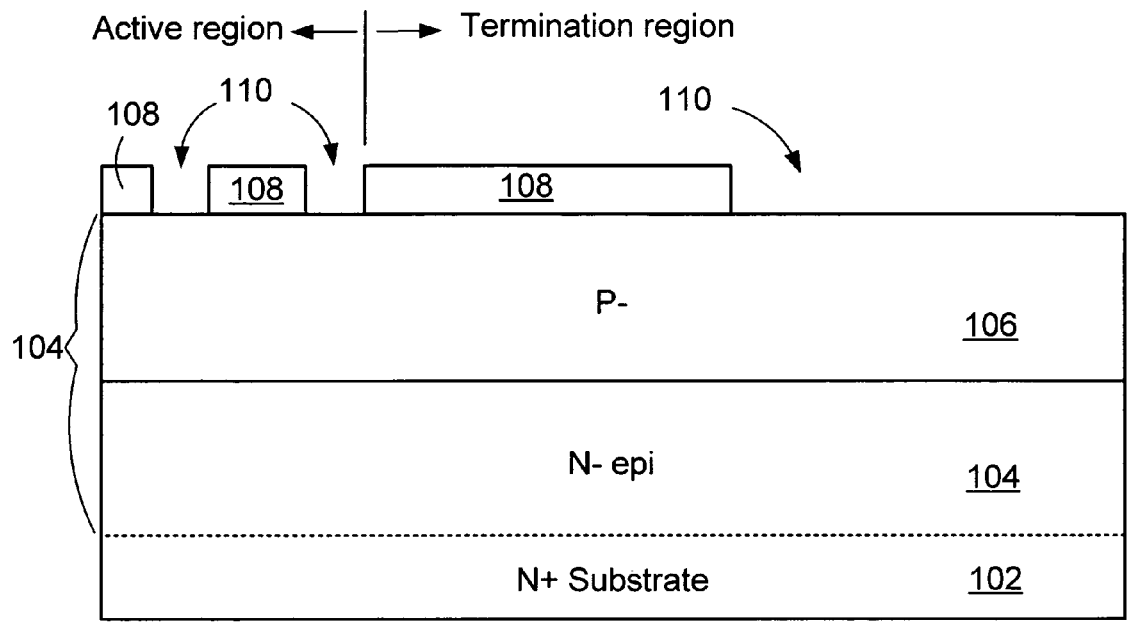
FIGS. 1A-1K are simplified cross-section views at various steps of a manufacturing process for forming a self-aligned MOSFET with improved trench termination structure, in accordance with an exemplary embodiment of the invention.
Figure 2:
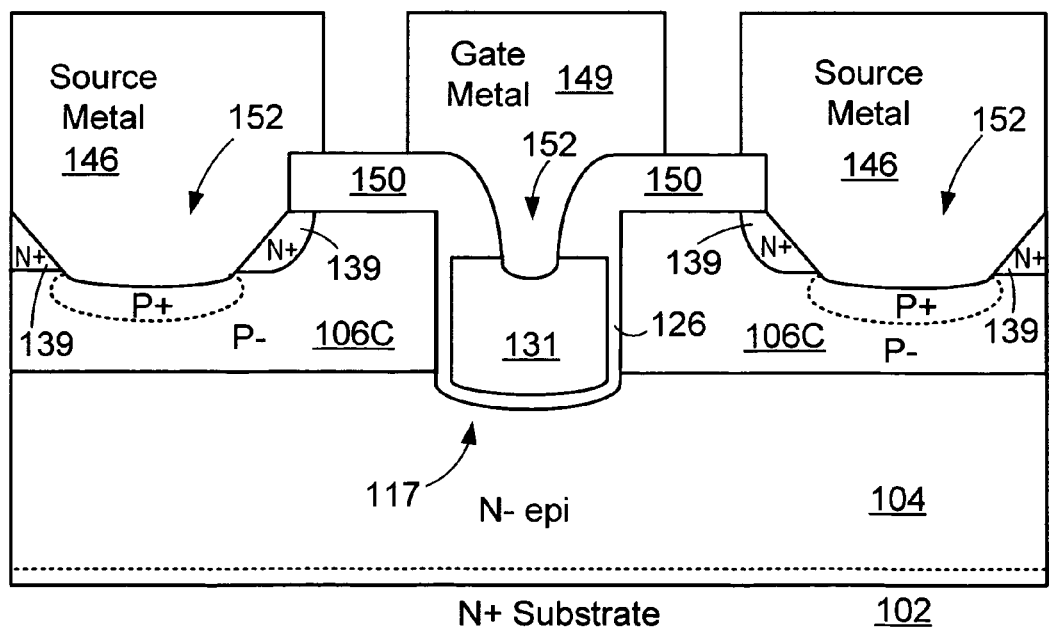
FIG. 2 is a simplified cross-section view showing a trench gate runner structure formed without requiring additional processing steps, in accordance with an exemplary embodiment of the invention.

In FIG. 1A, a lightly doped N-type epitaxial layer 104 is formed over a highly doped N-type substrate using conventional techniques. A lightly doped P-type well region 106 is formed in an upper portion of epitaxial layer 104 using a conventional blanket implantation of p-type dopants into epitaxial layer 104. A vertical line is used to show the border between the active region and the termination region of the die in which the FET is formed. As in conventional FETs, the active region of the die includes the active cell transistors, and the termination region surrounds the active region and includes the termination structure. In conventional processes, a mask is typically required to block the termination region from receiving the P-type implant. However, as will be seen, the structure and method of manufacture of the present invention allow the use of a blanket implant at this stage of the process thus eliminating the masking step that is typically required.

Figure 1B:
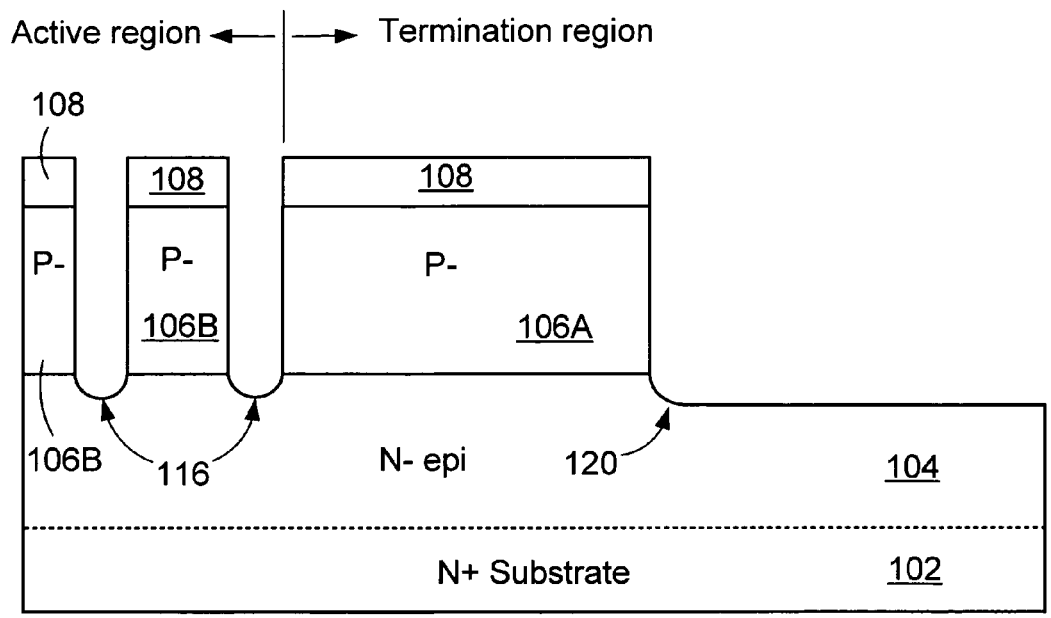

A hard mask 108 (e.g., comprising oxide) is then formed over well region 106 and then patterned to form openings 110 using conventional techniques. In FIG. 1B, silicon is removed through openings 110 to thereby form active gate trenches 116 in the active region, and to form a termination trench 120 in the termination region. Trenches 116 and 120 penetrate well region 106 such that well region 106 is divided into a number of active body regions 106B and a termination body region 106A. As shown, termination trench 120 extends to an edge of the die such that termination body region 106A terminates at a vertical wall of termination trench 120. The curvature of the P-type region present in the termination region of prior art structures is thus advantageously eliminated. While termination trench 120 is shown to extend into the street (i.e., regions separating adjacent dice on a wafer), termination trench 120 may also be formed so as to terminate before reaching the street. Also, while active trenches 116 and termination trench 120 are shown to terminate at a depth immediately below that of well region 106, trenches 116 and 120 could instead be extended deeper into epitaxial layer 104 or even into substrate 102 depending on the design goals and the target performance characteristics.

Figure 1C:
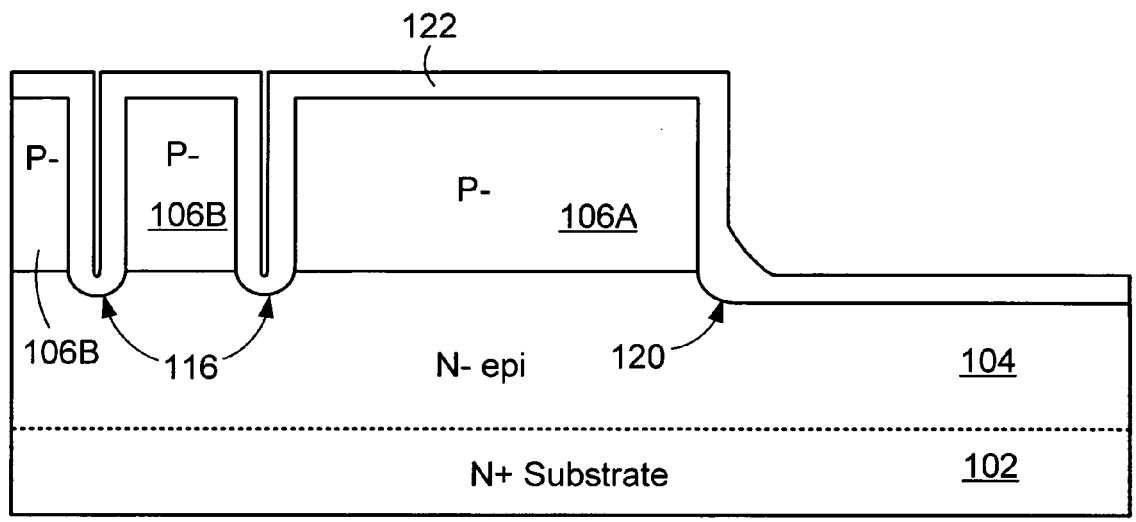
Figure 1D:
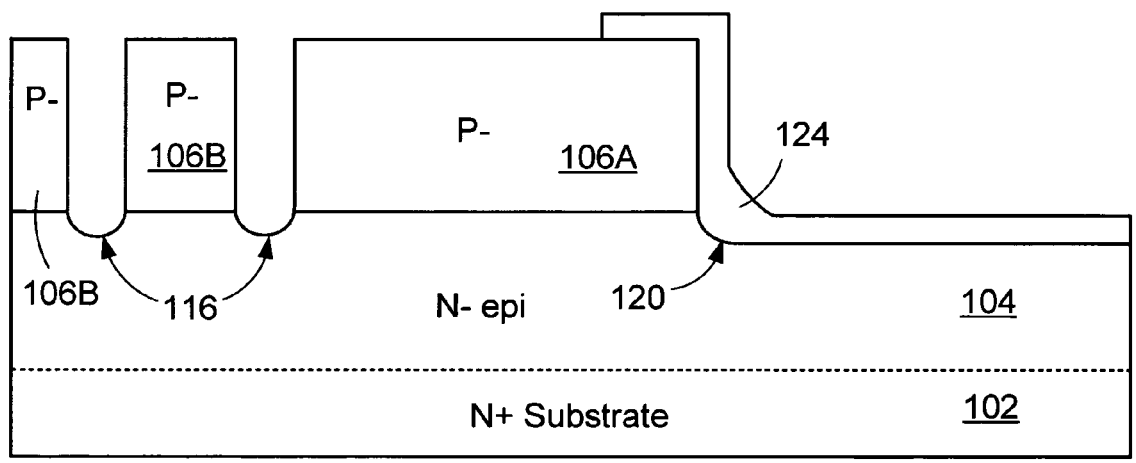

In FIG. 1C, hard mask 108 is removed and then a relatively thick shield dielectric layer 122 (e.g., comprising oxide) extending into active trenches 116 and termination trench 120 and over the mesa regions is formed using known techniques. The thickness of shield dielectric layer 122 is generally greater than that of the gate dielectric, and is primarily dictated by the voltage rating of the device. In FIG. 1D, shield dielectric layer 122 is masked and patterned in a photolithography step, and subsequently removed from the active region to yield shield dielectric layer 124 in the termination region. In this manner, a thick high quality dielectric layer is advantageously formed in termination trench 120. In an alternate embodiment, no shield dielectric is formed thus eliminating the masking and process steps of FIGS. 1C and 1D. In this alternate embodiment, the dielectric in termination trench 120 would comprise of a later formed gate dielectric layer (i.e., layer 126 in FIG. 1E) and a thicker dielectric layer (i.e., layer 127 in FIG. 1H) such as borophosphosilicate glass (BPSG) overlying the gate dielectric layer.

Figure 1E:
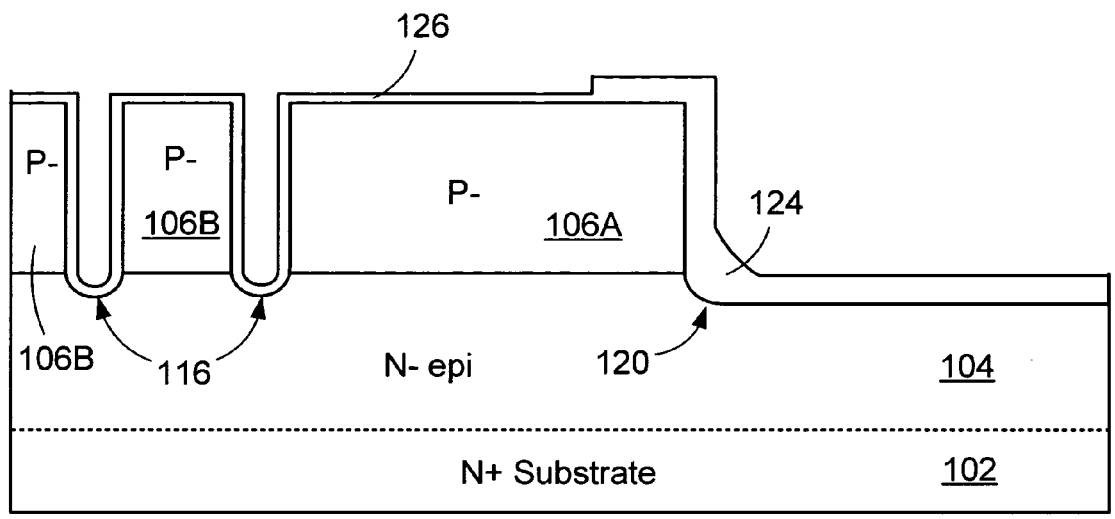
Figure 1F:
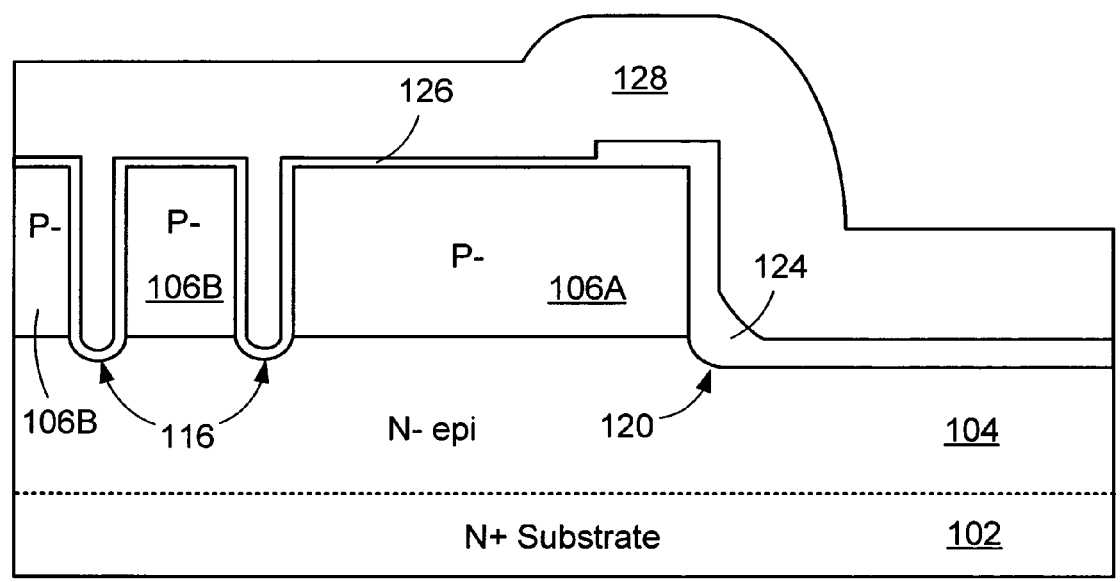
Figure 1G:
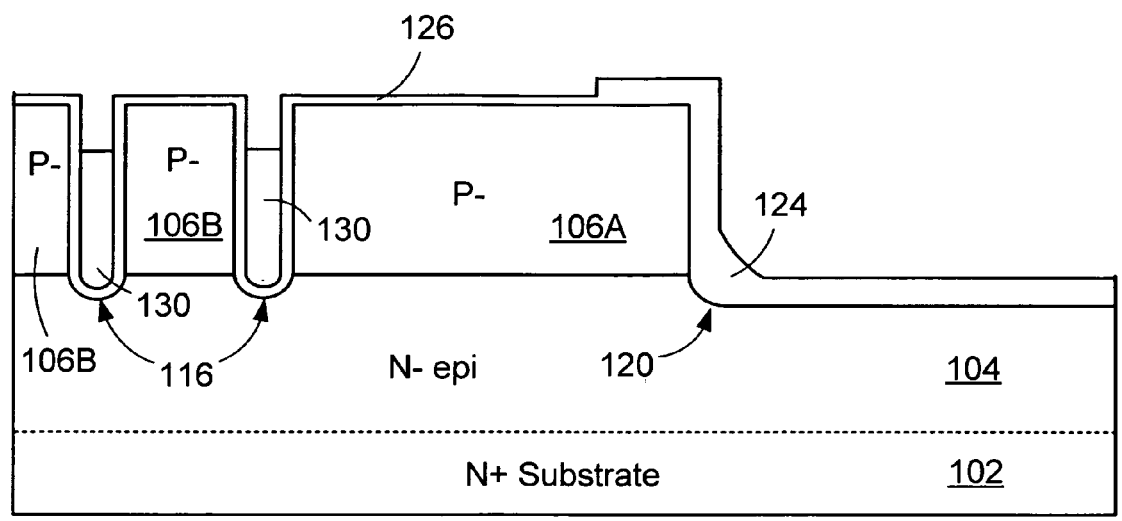

In FIG. 1E, a gate dielectric layer 126 is formed using conventional techniques such as oxidation of silicon. As shown, gate dielectric layer 126 is formed along all exposed silicon surfaces including the active gate trench sidewalls and bottom. In FIG. 1F, a polysilicon layer 128 is formed over the gate dielectric layer 126 and shield dielectric 124, filling active trenches 116 and extending into termination trench 120. In FIG. 1G, polysilicon layer 128 is recessed to a predetermined depth in active gate trenches 116 using known techniques. Gate electrodes 130 are thus formed. The polysilicon recessing results in complete removal of the polysilicon in termination trench 120. While conventional techniques require a masking step to separately define the polysilicon in the termination and active regions, the manufacturing process and structure of the present invention eliminate this masking step. In an alternate embodiment, active body regions 106B and termination body region 106A are formed by implanting P-type dopants after recessing of the polysilicon rather than early in the process flow (FIG. 1A).

Figure 1H:
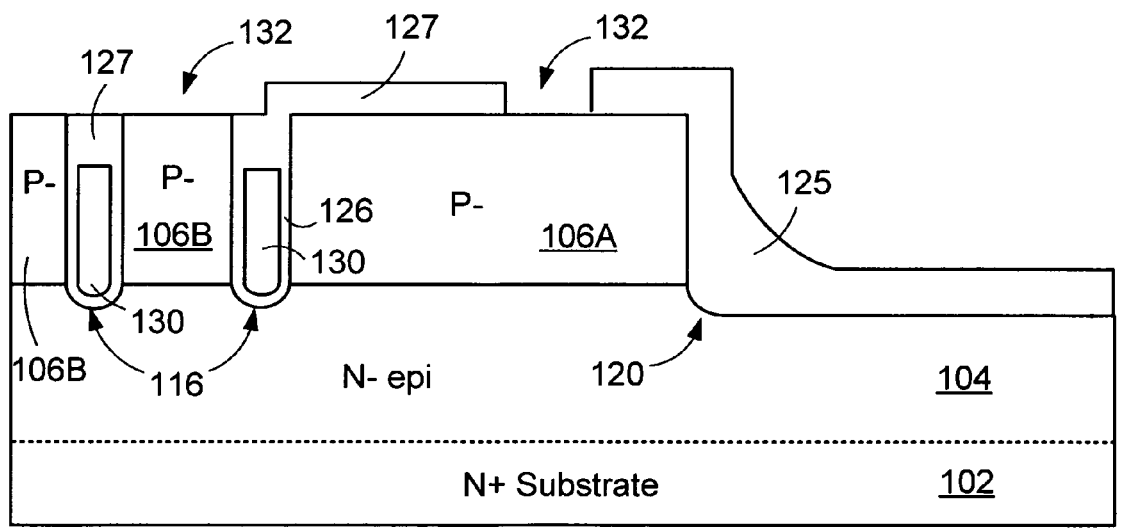
Figure 1I:
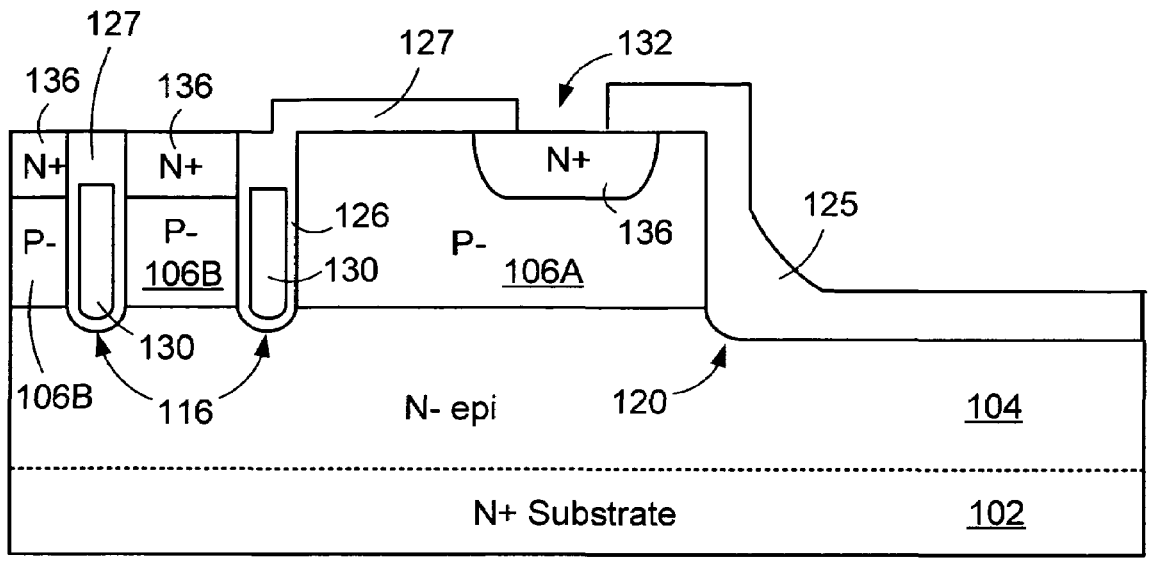

In FIG. 1H, a dielectric layer 127 is formed (e.g., using oxide deposition), and then patterned using a contact mask, followed by a dielectric etch using silicon as an etch stop. Active trenches 116 are thus filled with dielectric material 127, and openings 132 are formed to expose a surface portion of termination body region 106A as well as the mesa surfaces in the active region. Also, dielectric 127 together with shield dielectric 124 form a thicker dielectric 125 in termination trench 120. In FIG. 1I, a blanket source implant and drive are carried out to form N-type regions 136 in active body regions 106B and in termination body region 106A through exposed silicon surfaces. Dielectric 125 and 127 serve as blocking layers preventing their underlying regions from receiving the source implant. In conventional termination structures, because termination body region 106A is electrically tied to the source region, an additional masking step is required to prevent termination body region 106A from receiving the source implant in order to eliminate latch-up concerns. However, in the embodiment described herein, source implant into termination body region 106A can occur because termination body region 106A can float. A masking step required by prior art processes is thus eliminated.

Figure 1J:
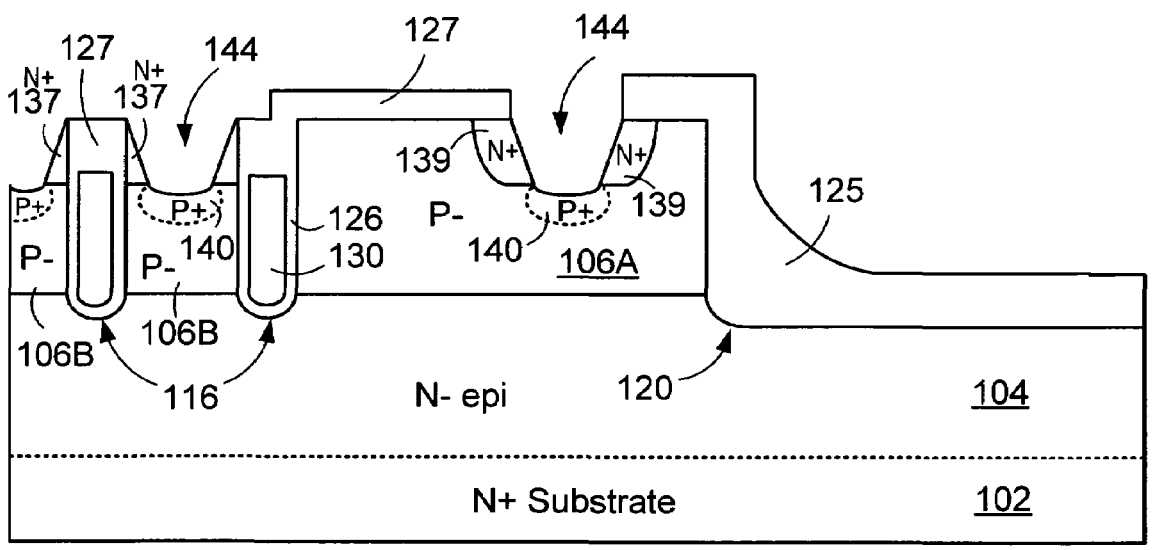

In FIG. 1J, a blanket dimple etch of silicon (e.g., an in-situ angled silicon etch) is carried out to recess all exposed silicon surfaces to below the bottom surface of N-type regions 136, thus forming contact openings 144. Contact openings 144 possess a sloped sidewall profile due to the angled etch process used. Triangular-shaped portions of the N-type regions 139 remaining in the array region form source regions 137 which are advantageously self-aligned to array trenches 116. Also, of the N-type region 136 in the termination region, portions 139 remain. Next, a blanket implant of P-type dopants followed by a drive-in step are carried out to form heavy body regions 140 in active body regions 106B and termination body region 106A through contact openings 144. Note that the heavy body region 140 in termination body region 106A provides a low resistance contact between field plate 148 and termination body region 106A. This is achieved without requiring additional processing steps.

Figure 1K:
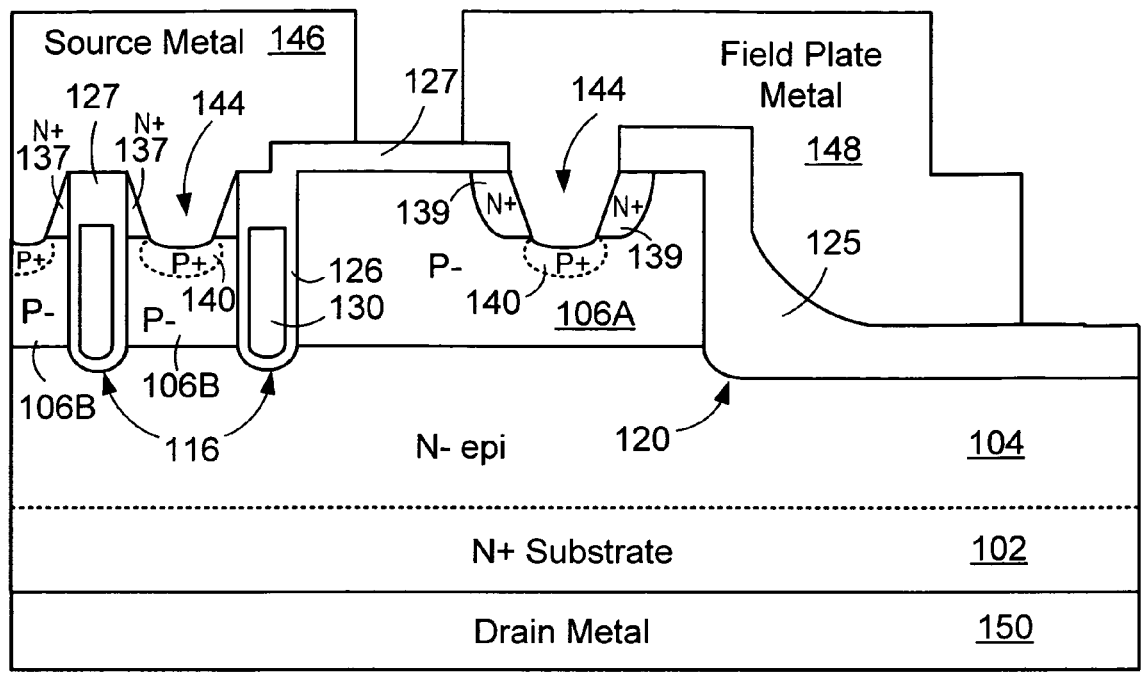

In FIG. 1K, conventional metal deposition, photolithography, and etch steps are carried out to form source metal 146, gate runner metal (layer 149 in FIG. 2), and termination field plate metal 148. The deposited metal fills in contact openings 144. Source metal 146 contacts source regions 137 and heavy body regions 140 in the active area of the device, and field plate metal 148 contacts N-type regions 139 and heavy body region 140 in the termination region. Source metal 146, field plate metal 148, and gate runner metal 149 are separated by gaps created by the metal etch process. A backside drain metal layer 150 is formed using conventional techniques.

In one embodiment, termination body region 106A is left unbiased and thus electrically floats. This allows termination body region 106A and field plate 148 to self-bias to a voltage greater than 0V. This in turn prevents impact ionization and high fields around the last mesa trench 116 (i.e., the active trench which defines the left wall of termination body region 106A). Since the last mesa region on the die (i.e., termination body region 106A) is floating and there is no current flow present during operation, the potential for latch-up which is typically caused by bipolar transistor formed by N-type eptiaxial layer 104, P-type termination body region 106A, and N-type source region 137 is eliminated. In an alternate embodiment, termination body region 106A is electrically biased to the same potential as the source regions.

While FIGS. 1A-1K show a process sequence for forming a particular trench termination structure together with a self-aligned MOSFET cell array, modifying this process sequence to form other trench termination structures would be obvious to one skilled in this art in view of this disclosure. For example, the process sequence of FIGS. 1A-1K could be modified to form any one of the trench termination structures disclosed in the above-referenced patent application Ser. No. 11/317,653, titled "Trench Field Plate Termination For Power Devices," filed on Dec. 22, 2005.

FIG. 2 is a simplified cross section view illustrating a trench gate runner structure formed using the process sequence of FIGS. 1A-1K. Gate runner trench 117 is formed at the same time active gate trenches 116 and termination trench 120 are formed (i.e., using the process steps corresponding to FIG. 1B). In one embodiment, the width of gate runner trench 117 is wider than active gate trenches 116 as dictated by photolithography limitations and the required size of contact opening 152 over gate runner 131. Gate runner trench 117 is lined with the gate dielectric layer 126 during the same process steps carried out to line active trenches 116 with gate dielectric layer 126 (i.e., the process steps corresponding to FIG. 1E). In an alternative embodiment, gate runner trench 117 is lined with the thicker dielectric layer 124 during the same process steps carried out to line termination trench 120 with dielectric layer 124 (i.e., the process steps corresponding to FIGS. 1C and 1D). The thicker dielectric in the gate runner trench advantageously minimizes the gate-drain capacitance. Similarly, the recessed gate runner electrode 131 is formed during the same process steps carried out for forming gate electrodes 130 in the active trenches (i.e., the process steps corresponding to FIGS. 1F and 1G).

Dielectric layer 150 and contact openings 152 are formed during the same process steps carried out for forming dielectric layer 127 and contact openings 132 (i.e., the process steps corresponding to FIG. 1H). Gate metal 149 electrically contacting gate runner electrode 131 through contact opening 152 is formed during the same metal deposition, photolithograpy, and metal etch process sequence carried out for forming source metal 146 and field plate metal 148 (i.e., the process steps corresponding to FIG. 1K). The remaining layers of the trenched gate runner structure in FIG. 2 are similarly formed during corresponding process steps in FIGS. 1H-1J. Gate runner trench 117 may extend along the periphery, along a central area of the die, and/or other areas of the die as needed. In a specific embodiment, gate runner trenches extend along a center of the die and additional gate runner trenches extend along sides of the die connect gate electrodes located within the active area of the device. In another embodiment, the cells in the active region are stripe shaped extending along a first direction, and a gate runner trench extends along a direction perpendicular to and is contiguous with the active gate trenches.

In accordance with the invention, termination structures that are usually patterned separately from the active region are formed at the same time corresponding structures are formed in the array region, thus reducing the mask count and number of process steps. For example, in conventional implementations, separate ion implantation and masking steps are carried out to form the P-type well region in the termination area and the P-type well region in the active area of the die. By using a blanket implant (i.e., using no mask), the P-type well region in the termination area and the P-type well region in the active area of the die are formed simultaneously. Thus, both the number of process steps and the number of masks used are reduced. Similarly, by utilizing a trench embedded gate runner, the number of required masks is reduced. The same process steps can be used to simultaneously form: (i) the termination trench, (ii) the gate runner trenches, and (iii) the active gate trenches, thus reducing the number of fabrication steps and masking steps. Additionally, by embedding the gate runner in a trench (as opposed to the conventional planar gate runners) minimize silicon consumption. These advantages are achieved together with a trench-gate FET structure with self-aligned source and heavy body regions. In all, a highly compact, low cost trench gate FET with improved performance is achieved.

While the present invention has been particularly shown and described with reference to exemplary embodiments thereof, it will be understood by those of ordinary skill in the art that various changes in form and details may be made therein without departing from the spirit and scope of the present invention as defined by the claims.

What is claimed is:

1. A method of forming a trench gate field effect transistor (FET) in a semiconductor die comprising an active region for housing active transistor cells and a termination region surrounding the active region, the method comprising:

forming a well region in the active region and the termination region at the same time, the well region being formed in a silicon region having a conductivity type opposite that of the well region;

simultaneously forming a plurality of active gate trenches in the active region and a non-active termination trench in the termination region, the plurality of active gate trenches and the non-active termination trench extending into and penetrating through the well region to there by divide the well region into a plurality of active body regions in the active region and a termination body region in the termination region;

using a mask, forming an opening over the termination body region and an opening over the active region;

implanting dopants into the active body regions through the opening over the active region and into the termination body region through the opening over the termination body region, thereby forming a first region in each active body region and in the termination body region, the first regions having a conductivity type opposite that of the well region; and recessing exposed surfaces of all first regions using a silicon etch to form a bowl-shaped silicon recess having slanted walls and a bottom protruding through each first region such that portions of each first region remain in a corresponding active body region, the remaining portions of the first regions in the active body regions forming source regions which are self-aligned to the active gate trenches.

2. The method of claim 1 further comprising:

implanting dopants into the bowl-shaped silicon recesses to form a heavy body region in each active body region and in the termination body region, the heavy body regions having the same conductivity type as the well region.

3. The method of claim 2 further comprising:

forming a metal layer over the semiconductor die;

patterning the metal layer to form: (i) a source metal layer extending into each bowl-shaped silicon recess in the active region to electrically contact the source regions and the heavy body regions in the active region, and (ii) a field plate extending into the non-active termination trench and into the bowl-shaped silicon recess formed in the termination body region to electrically contact the heavy body region formed in the termination body region, wherein the source metal layer and the field plate are insulated from one another.

4. The method of claim 1 further comprising:

forming a termination dielectric layer in the non-active termination trench;

forming a field plate comprising conductive material in the trench over the termination dielectric layer, the termination dielectric layer insulating all portions of the field plate inside the non-active termination trench from all silicon regions surrounding the non-active termination trench, the field plate extending out of the non-active termination trench and into the bowl-shaped silicon recess formed in the termination body region to thereby electrically contact the heavy body region formed in the termination body region.

5. The method of claim 4 wherein the conductive material is a metal.

6. The method of claim 1 further comprising:

forming a gate dielectric layer lining sidewalls of each active gate trench;

forming a recessed gate in each active gate trench, wherein the termination dielectric layer is thicker than the gate dielectric layer; and forming a dielectric material over each recessed gate.

7. The method of claim 1 wherein the non-active termination trench extends to an edge of the semiconductor die such that the non-active termination trench forms a vertical wall at which the well region terminates.

8. The method of claim 1 wherein the active gate trenches and the non-active termination trench terminate at the same depth.

9. The method of claim 1 wherein the termination body region is electrically unbiased so that it floats during operation.

10. The method of claim 1 wherein the simultaneously forming step comprises:

forming non-active gate runner trenches at the same time the active gate trenches and the non-active termination trench are formed, the non-active gate runner trench, the active gate trenches and the non-active termination trench extending to the same depth; and forming a recessed gate electrode in each active gate trench and a recessed gate runner electrode in the non-active gate runner trench at the same time, the recessed gate electrode in each active gate trench being electrically connected to the recessed gate runner electrode in the non-active gate runner trench.

11. The method of claim 10 wherein the non-active gate runner trench is wider than the active gate trenches.

12. The method of claim 10 wherein the active gate trenches are stripe shaped extending along a first direction, and the non-active gate runner trench extends, at least in part, along a direction perpendicular to and is contiguous with the active gate trenches.

13. A method of forming a trench gate field effect transistor (FET) in a semiconductor die comprising an active region wherein active transistor cells are formed and a termination region surrounding the active region, the method comprising:

forming a well region in the active region and the termination region at the same time, the well region being formed in a silicon region having a conductivity type opposite that of the well region;

simultaneously forming a plurality of active gate trenches in the active region, a non-active gate runner trench, and a non-active termination trench in the termination region, the plurality of active gate trenches, the non-active gate runner trench, and the non-active termination trench extending into and penetrating through the well region to thereby divide the well region into a plurality of active body regions in the active region and a termination body region in the termination region;

forming a recessed active gate electrode in each active gate trench and a recessed gate runner electrode in the non-active gate runner trench at the same time, the recessed active gate electrodes being electrically connected to the recessed gate runner electrode;

defining an opening over the termination body region and an opening over the active region using a mask;

implanting dopants into the active body regions through the opening in the active region and into the termination body region through the opening over the termination body region, thereby forming a first region in each active body region and in the termination body region, the first regions having a conductivity type opposite that of the well region; and recessing exposed surfaces of all first regions using a silicon etch to form a bowl-shaped silicon recess having slanted walls and a bottom protruding through the first region such that portions of each first region remain in a corresponding active body region, the remaining portions of the first region in the active body regions forming source regions which are self-aligned to the active gate trenches.

14. The method of claim 13 further comprising:

implanting dopants into the bowl-shaped silicon recesses to form a heavy body region in each active body region and in the termination body region, the heavy body regions having the same conductivity type as the well region.

15. The method of claim 13 further comprising:

forming a termination dielectric layer in the non-active termination trench;

forming a field plate comprising conductive material in the non-active termination trench, the termination dielectric layer insulating all portions of the field plate inside the non-active termination trench from all silicon regions surrounding the non-active trench termination, the field plate extending out of the non-active termination trench and into the bowl-shaped silicon recess formed in the termination body region to thereby electrically contact the heavy body region formed in the termination body region.

16. The method of claim 15 wherein the conductive material is a metal.

17. The method of claim 15 further comprising:

prior to forming the recessed active gate electrode and the recessed gate runner electrode, forming a gate dielectric layer lining sidewalls of each active gate trench.

18. The method of claim 15 wherein the non-active termination trench extends to an edge of the die such that the non-active termination trench forms a vertical wall at which the well region terminates.

19. The method of claim 13 wherein the active gate trenches, the non-active gate runner trench, and the non-active termination trench terminate at the same depth.

20. The method of claim 13 wherein the termination body region is electrically unbiased so that it floats during operation.

21. The method of claim 13 wherein the non-active gate runner trench is wider than the active gate trenches.

22. The method of claim 13 wherein the active gate trenches are stripe shaped extending along a first direction, and the non-active gate runner trench extends, at least in part, along a direction perpendicular to and is contiguous with the active gate trenches.

* * * * *